United States Patent
O'Brien et al.

(10) Patent No.: US 7,629,252 B2
(45) Date of Patent: Dec. 8, 2009

(54) CONFORMAL ELECTROLESS DEPOSITION OF BARRIER LAYER MATERIALS

(75) Inventors: Kevin P. O'Brien, Portland, OR (US); Chin-Chang Cheng, Portland, OR (US); Ramanan V. Chebiam, Hillsboro, OR (US); Valery M. Dubin, Portland, OR (US); Sridhar Balakrishnan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 413 days.

(21) Appl. No.: 11/318,137

(22) Filed: Dec. 23, 2005

(65) Prior Publication Data

US 2007/0148952 A1 Jun. 28, 2007

(51) Int. Cl.
*H01L 21/4763* (2006.01)
(52) U.S. Cl. ........... 438/641; 438/627; 438/677; 438/678; 257/E21.584
(58) Field of Classification Search ............. 438/627, 438/641, 677, 678; 257/E21.584
See application file for complete search history.

(56) References Cited

U.S. PATENT DOCUMENTS

| | | | |
|---|---|---|---|
| 6,344,413 B1 * | 2/2002 | Zurcher et al. | 438/678 |
| 6,667,551 B2 * | 12/2003 | Hanaoka et al. | 257/750 |
| 6,958,547 B2 | 10/2005 | Dubin et al. | |
| 7,365,011 B2 * | 4/2008 | Lavoie et al. | 438/687 |
| 2004/0137161 A1 * | 7/2004 | Segawa et al. | 427/430.1 |
| 2004/0235294 A1 * | 11/2004 | Imori et al. | 438/678 |

OTHER PUBLICATIONS

Valery M. Dubin et al., "Use of Conductive Electrolessly Deposited Etch Stop Layers, Liner Layers and Via Plugs in Interconnect Structures", U.S. Appl. No. 10/139,052, filed May 3, 2002, 34 pages.
Steven W. Johnston et al., "Forming a Copper Diffusion Barrier", U.S. Appl. No. 10/284,576, filed Oct. 31, 2002, 23 pages.
Valery M. Dubin et al., "Method for Forming Electroless Metal Low Resistivity Interconnects", U.S. Appl. No. 10/458,042, filed Jun. 9, 2003, 18 pages.
Ting Zhong et al., "Methods to Deposit Metal Alloy Barrier Layers", U.S. Appl. No. 10/957,117, filed Sep. 30, 2004, 34 pages.
Ting Zhong et al., "Forming a Barrier Layer in Joint Structures", U.S. Appl. No. 11/078,611, filed Mar. 11, 2005, 22 pages.
Harsono Simka et al., "Organometallic Precursors for the Chemical Phase Deposition of Metal Films in Interconnect", U.S. Appl. No. 11/096,860, filed Mar. 31, 2005, 31 pages.

* cited by examiner

*Primary Examiner*—Zandra Smith
*Assistant Examiner*—Christy L Novacek
(74) *Attorney, Agent, or Firm*—Blakely, Sokoloff, Taylor & Zafman LLP

(57) ABSTRACT

Methods of fabricating interconnect structures utilizing barrier material layers formed with an electroless deposition technique utilizing a coupling agent complexed with a catalytic metal and structures formed thereby. The fabrication fundamentally comprises providing a dielectric material layer having an opening extending into the dielectric material from a first surface thereof, bonding the coupling agent to the dielectric material within the opening, and electrolessly depositing the barrier material layer, wherein the electrolessly deposited barrier material layer material adheres to the catalytic metal of the coupling agent.

13 Claims, 6 Drawing Sheets

CONFORMAL ELECTROLESS DEPOSITION OF BARRIER LAYER MATERIALS

BACKGROUND OF THE INVENTION

1. Field of the Invention

An embodiment of the present invention relates to the fabrication of interconnect structures in microelectronic devices. In particular, embodiments of the present invention relate to utilizing a coupling agent complexed with a catalytic metal and electroless deposition to form conformal barrier material layers.

2. State of the Art

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects".

One process used to form interconnects is known as a "damascene process". In a typical damascene process, a photoresist material is patterned on a dielectric material and the dielectric material is etched through the photoresist material patterning to form a hole or a trench (hereinafter collectively referred to as "an opening" or "openings"). The photoresist material is then removed (typically by an oxygen plasma) and the opening is then filled with a conductive material (e.g., such as a metal or metal alloys). The filling of the opening may be accomplished by either physical vapor deposition, chemical vapor deposition, or electroplating, as will be understood to those skilled in the art. When the opening is a hole, the resulting filled structure is referred to herein as a "via". When the opening is a trench, the resulting filled structure is referred to herein as a "filled trench". The term "interconnect" is defined herein to include all interconnection components including filled trenches and vias.

Generally, a barrier material layer is deposited on the dielectric material within the opening prior to the deposition of the conductive material to prevent diffusion of a conductive material into the dielectric material. The barrier material layers are formed by depositing barrier material, such as tantalum nitride/tantalum and the like, using a physical vapor deposition ("PVD") sputtering technique. Sputtering is a physical process wherein atoms in a solid target material are ejected into a gas phase due to bombardment of the target by ions. The ions are generated by a plasma that is struck within a sputtering chamber. The ejected ions are then deposited on a substrate (i.e., the dielectric material), which is placed in the sputtering chamber.

Once the barrier material layer is formed, a conductive material is deposited in the opening usually with the assistance of a seed layer deposited on the barrier material layer prior to the deposition of the conductive material. The conductive material may be deposited by any technique known in the art, including but not limited to physical vapor deposition, chemical vapor deposition, electroless, and electroplating. The resulting structure is planarized, such as by chemical mechanical polishing or by an etching process, which removes the conductive material, which is not within the opening, from the surface of the dielectric material, to form the interconnect. Of course, a variety of vias and filled trenches may be formed in the various dielectric material layers to electrically connect to one another and/or to various electronic components. In another damascene process, known as a "dual damascene process", trenches and vias are substantially simultaneously filled with the conductive material with a single deposition.

As the density of integrated circuits within microelectronic devices continues to increase with each successive technology generation, the interconnects become smaller and their aspect ratios (i.e., the ratio of depth to width) increases. As shown in FIGS. 9 and 10, a problem with small size and/or high aspect ratios is that the sputtering process used to form the barrier material 302 can build up at an opening 304 proximate a first surface 306 of a dielectric material 308 (i.e., the "mouth" 310 of the opening 304) during deposition. This barrier material build-up is a natural consequence of the "line-of-sight" nature of the sputtering process, as will be understood to those skilled in the art.

A conductive material 312 is then deposited by electroplating; however, the build-up (illustrated within dashed circle 314 in FIGS. 9 and 10) blocks the path of the deposited conductive material 312 and, as shown in FIG. 11, can result in voids 316 forming within the conductive material 312 in the opening 304 (shown in FIGS. 9 and 10). FIG. 11 illustrates an interconnect 318 formed after the conductive material 312, which is not within the opening 304 (shown in FIGS. 9 and 10), from the dielectric material first surface 306. The voids 316 can have different sizes, distributions, and locations within the interconnect 318. For example, some voids 316 may be so large that they effectively break the conductive path of the interconnect 318, which may result in the failure of the microelectronic device, thereby having an immediate yield impact. Additionally, the voids 316 may also be small, which may have an immediate impact by restricting the flow of electrons along the interconnect 318 and/or may have a negative impact on the long-term reliability of the microelectronic device. Additionally, direct electroplating of the barrier materials is not an attractive option due to the large voltage drop across of the wafer and the weak adhesion strength between the air oxidized barrier material and the conductive material, such as copper, as will be understood to those skilled in the art.

Therefore, it would be advantageous to develop techniques and materials to deposit barrier material layers such that barrier material layer build-up at the entrance of the features is reduced or substantially eliminated, which thereby reduces or substantially eliminates void formation during the fabrication of interconnects for microelectronic devices.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
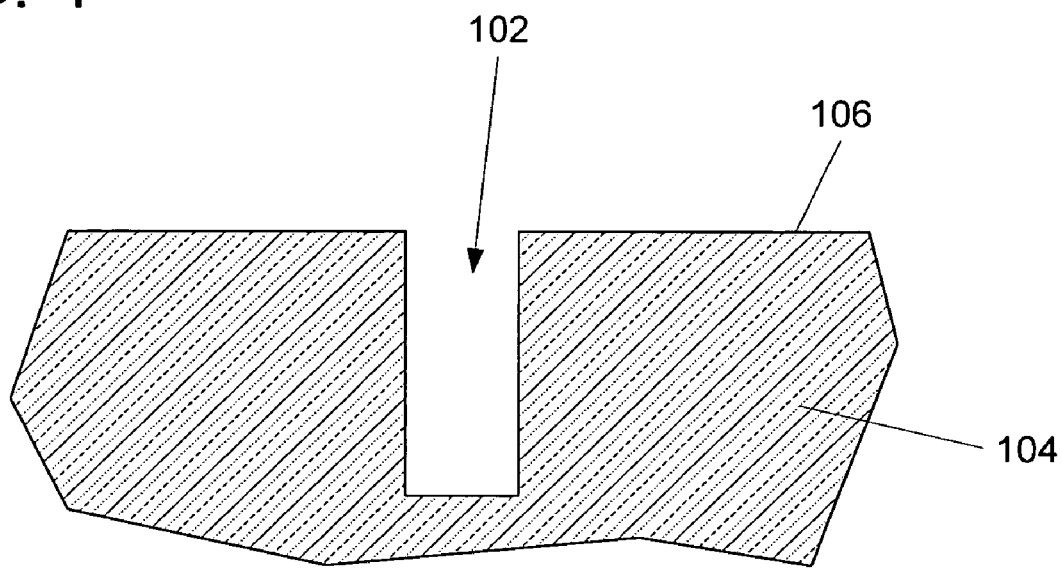
FIG. 1 illustrates a side cross-sectional view of an opening formed in a dielectric material, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention relate to the fabrication of interconnect structures in microelectronic devices and, more specifically, to forming barrier material layers for the interconnect structures. The barrier material layers are fabricated by electroless deposition utilizing a coupling agent complexed with a catalytic metal, wherein the electrolessly deposited barrier material layer material adheres to the catalytic metal.

In one embodiment of the present invention, as shown in FIG. 1, an opening 102 is formed in a dielectric material layer 104 extending into the dielectric material layer 104 from a first surface 106 thereof. The dielectric material layer 104 may include, but is not limited to, silicon oxide, silicon nitride, carbon doped oxide, fluorinated silicon oxide, boron/phosphorous doped oxide, any porous low-k dielectric, and the like. The opening 102 may be formed by any technique known in the art, including but not limited to, lithography, ion milling, laser ablation, and the like.

Figure 2:
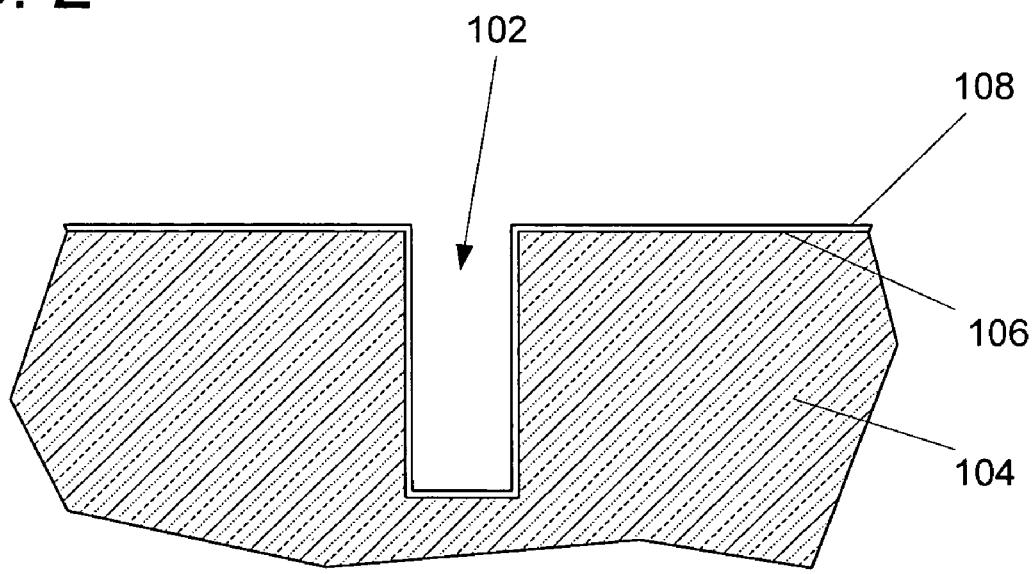
FIG. 2 illustrates a side cross-sectional view of a barrier material layer lining the opening of FIG. 1, according to the present invention.

As shown in the FIG. 2, a barrier material layer 108 is electrolessly deposited in the opening 102 to substantially conformally abut the dielectric material layer 104. Such barrier material layers 108 are used to prevent the diffusion of a subsequently deposited conductive material, such as copper and copper alloys, into the dielectric material layer 104. Such diffusion can adversely affect the quality of microelectronic device through increased leakage current and/or decreased reliability between interconnects. A typical material used for the barrier material layer 108, particularly for copper interconnects, may include cobalt (Co), tantalum (Ta), titanium (Ti), tungsten (W), ruthenium (Ru), molybdenum (Mo), niobium (Nb), platinum (Pt), palladium (Pd), rhenium (Re), osmium (Os), iridium (Ir), gold (Au), rhodium (Rh), copper (Cu) and the like, as well as nitrides, oxides, and alloys thereof. A portion of the barrier material layer 108 may also extend over and abut the dielectric material layer first surface 106, as a result of the deposition process. It is, of course, understood, that the term "barrier material layer" is to be interpreted to encompass any material which acts as a barrier to diffusion and also include any material which lines or otherwise reside between the dielectric material layer and the subsequently deposited conductive material.

Figure 3:
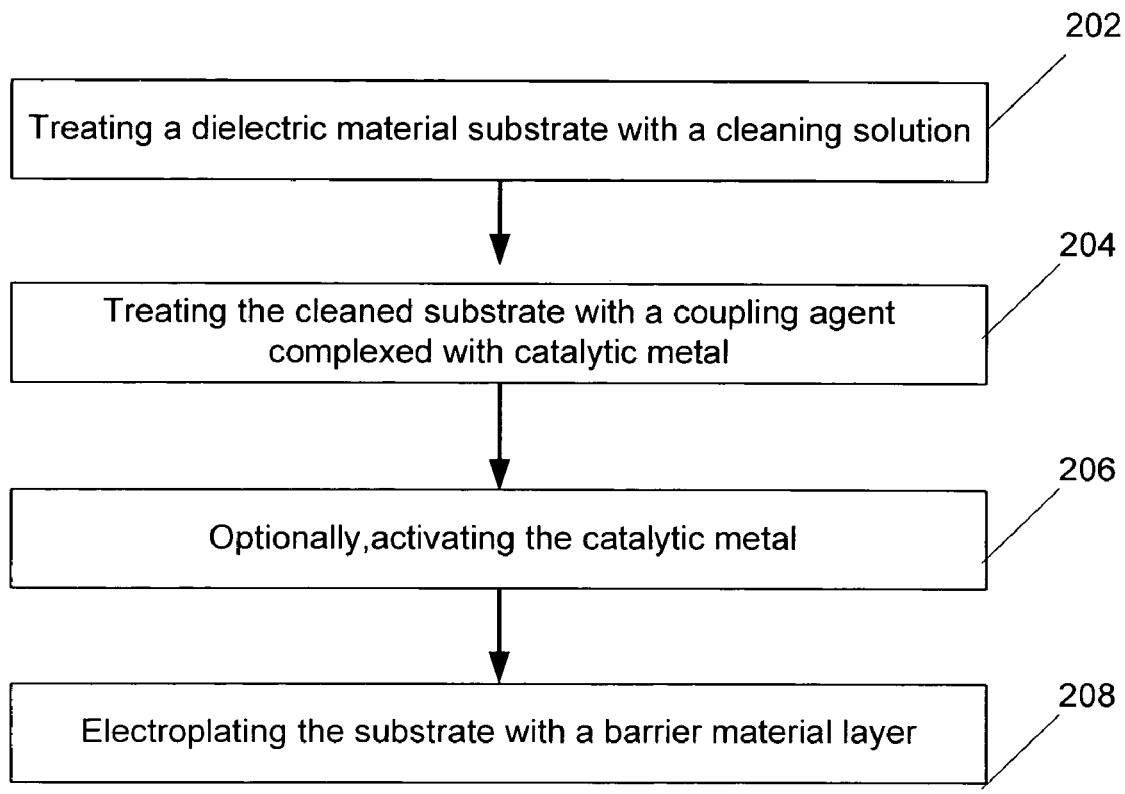
FIG. 3 is a flow diagram of one embodiment of forming a barrier material layer, according to the present invention.

In one embodiment of the present invention, the electroless deposition of the barrier material layer 108, as shown in FIG. 2, may be achieved by the use of a coupling agent, such as an azo-silane with varying length of carbon backbone chains, complexed with a catalytic metal. Coupling agent may also include phosphine, pyridines, and alkyl amines, in lieu of the azo group. The overall process for the deposition is illustrated in FIG. 3, wherein the substrate is treated with a cleaning solution (step 202), such as a mild acidic etchant, to remove any contaminants. The mild acidic etch, such as citric acid, may have a pH of between about 1 and 5 and may be applied from about 10 to 100 degrees Celsius to remove any contaminants. It is, of course, understood that this is merely a possible cleaning solution. Any cleaning solution which improves wetting to make the surface more hydrophilic, as known in the art, may be utilized. The cleaning treatment may include immersion within or spraying of the cleaning solution.

Figure 4:
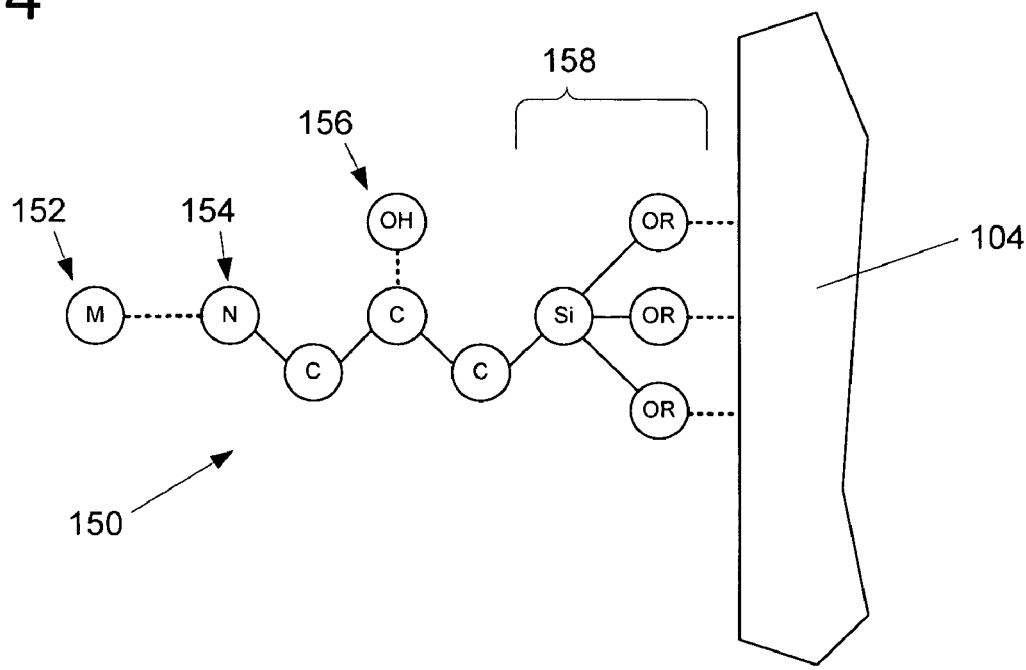
FIG. 4 is a schematic of an azo-silane coupling agent complexed with a catalytic metal, according to the present invention.

The cleaned substrate is then treated with a coupling agent complexed with a catalytic metal (step 204 of FIG. 3) to provide a nucleation surface for a subsequent deposition of a conductive material. In one embodiment, the coupling agent 150 (FIG. 4) may be an azo-silane such as:

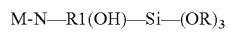

wherein:
  M is a catalytic metal, including but not limited to palladium (Pd) or ruthenium (Ru) [element 152 of FIG. 4]
  R1 may be C1-C4 (FIG. 4 illustrates R1OH as —$CH_2$—CH(OH)—$CH_2$—)
  OR are alkyl groups
  N is nitrogen atom [element 154 of FIG. 4]
  OH is a hydroxyl [element 156 of FIG. 4]
  Hydrogen atoms fill out the remainder of the bonding groups and are not shown The silane portion 158 (i.e., —Si—$(OR)_3$) of the coupling agent 150 bonds to the dielectric material layer 104, as shown in FIG. 4. In one embodiment, the coupling agent 150 is selected to form a self assembled monolayer. For example, the hydroxyl group 156 of the coupling agent 150 reacts with other like molecules by intermolecular hydrogen bonding and assists in the formation of a monolayer. The catalytic metal ions, such as palladium, bond to the amino group by weak bonding with the nitrogen atoms lone pair electrons.

Referring back to FIG. 3, the coupling agent may by activated (step 206) by partially reducing the palladium ion to metallic palladium which acts as a catalyst and starts behaving as a nucleating center for metal deposition. Any reducing agent known in the art which can partially reduce palladium ions (i.e., Pd2+) to palladium (i.e., Pd) can be used.

The activated coupling agent-coated substrate is then electroless plated with a barrier material layer 108 (step 208 of FIG. 3), wherein the catalytic metal initiates the plating. The electroless deposition process may include any autocatalytic (i.e., no external power supply is applied) deposition of the barrier material layer 108 through the interaction of a metal salt and a chemical reducing agent. The electroless plating process results in a highly conformal layer, as it is not a line of sight process, and can be controlled to a deposition rate of less than about 10 nn/min, as will be understood to those skilled in the art.

In one embodiment, the electroless deposition solution may comprise cobalt and alloys thereof (such as cobalt alloyed with tungsten, boron, phosphorus, molybdenum, and/or the like), nickel and alloys thereof (such as nickel alloyed with tungsten, boron, phosphorus, molybdenum, and/or the like), copper, palladium, silver, gold, platinum metals and their selective alloys. It is, of course, understood that the electroless deposition solution may also include additives (such as suppressors, i.e., polyethylene glycol, and anti-suppressors, i.e., di-sulfide) and complexing agents (such as thiosulfate and peroxodisulfate). Although a few examples of materials that may comprise the electroless deposition solution are described here, the solution may comprise other materials that serve to deposit the conductive material electrolessly. The technique of electrolessly depositing a metal or metal alloy is known to those skilled in the art, and may be performed either by immersing the substrate in an electroless deposition solution, by semi-immersion, or by spraying the electroless deposition solution onto the substrate or target (e.g., the dielectric material layer 104).

Figure 5:
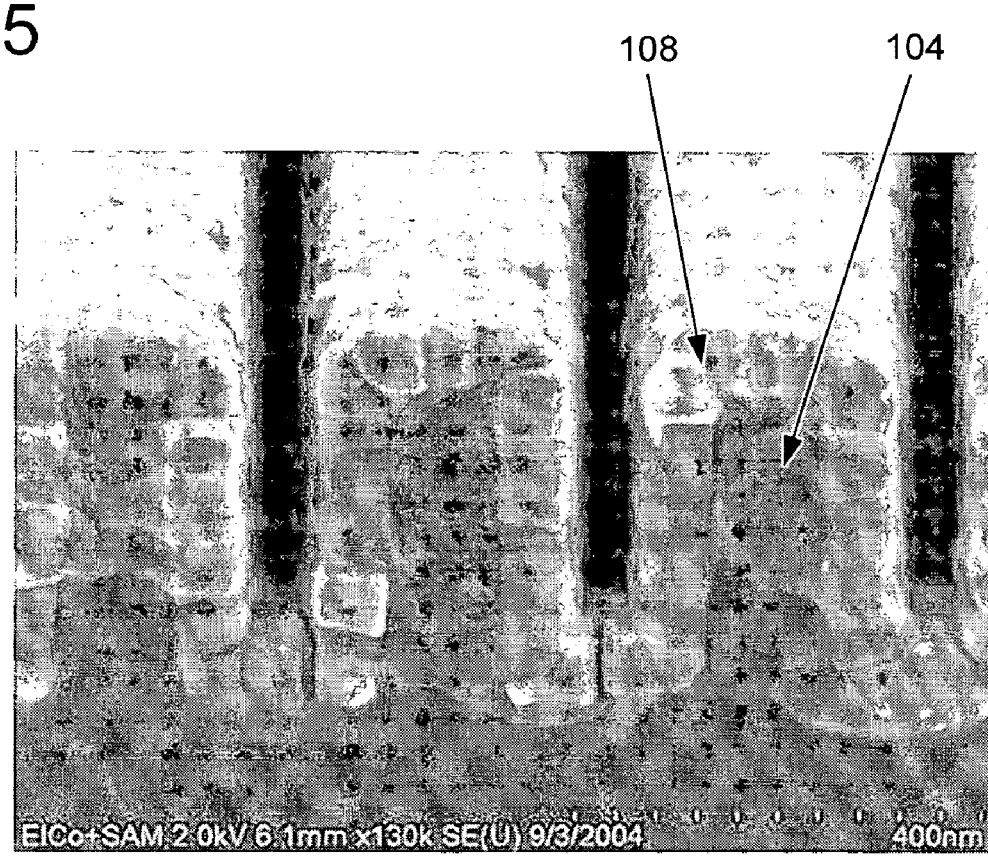
FIG. 5 is a side cross-sectional micropograph of a substrate having a barrier material layer disposed thereon, according to the present invention.

FIG. 5 is a cross-sectional micrograph illustrating a series of openings in a carbon doped oxide dielectric material 104 having a cobalt barrier material layer 108 deposited therein, according to the present invention. The cobalt barrier layer 108 was formed by applying step 204 in FIG. 3 and step 208 where it is comprised of a cobalt metal source and a minor constituent, such as tungsten, molybdenum, rhenium, suitable complexing agents, such as citric acid or ethylenediaminetetraacetic acid and a reducing agent such as hypophosphite and dimethylaminobenzaldehyde.

Figure 6:
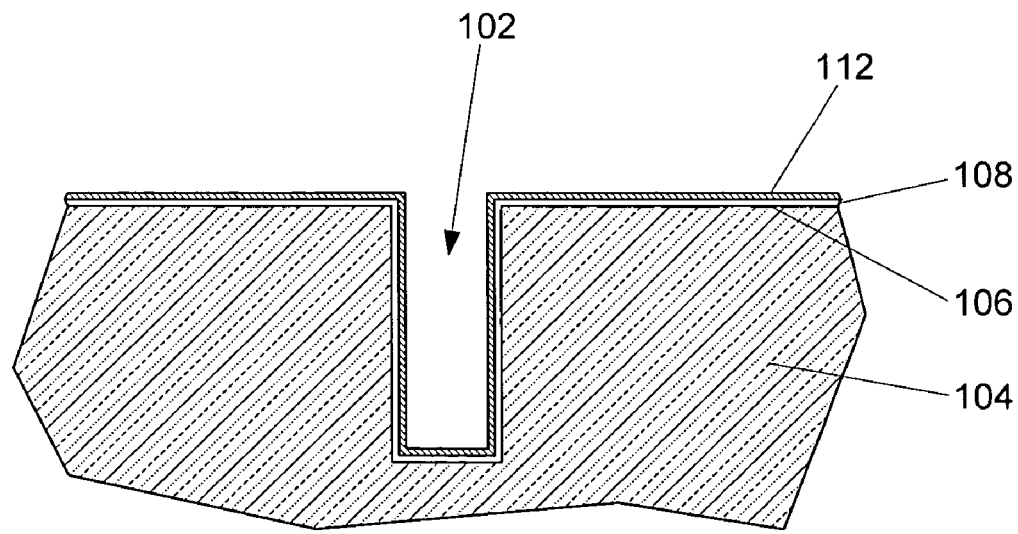
FIG. 6 illustrates a side cross-sectional view of an optional seed layer abutting the barrier material of FIG. 2, according to the present invention.

As shown in FIG. 6, a seed material 112 may optionally be deposited on the barrier material layer 108. The seed material 112 may be deposited in an atomic layer deposition process or a physical deposition process, such as magnetron sputtering, but is not so limited. The seed material 112 provides a nucleation surface for a subsequent deposition of the conductive material. The seed material 112 may include, but is not limited to, copper (Cu), palladium (Pd), cobalt (Co), nickel (Ni), ruthenium (Ru), platinum (Pt), alloys thereof, and the like. It is, of course, understood that the seed material 112 may not be necessary, as the barrier material layer 108 itself may serve as a nucleation surface for the subsequent deposition of the conductive material.

Figure 7:
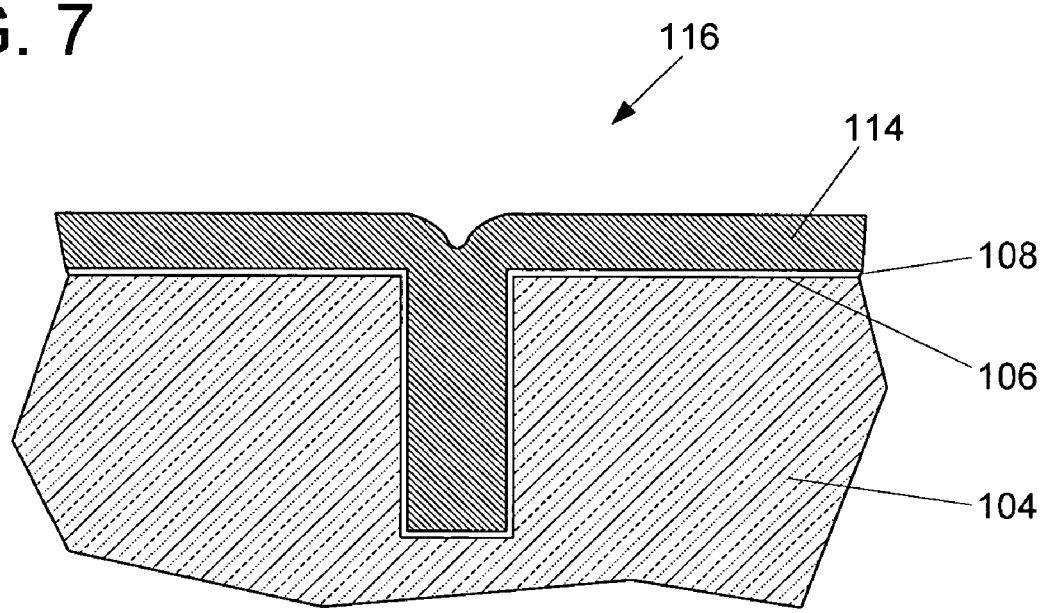
FIG. 7 illustrates a side cross-sectional view of the opening of FIG. 3 filled with a conductive material, according to the present invention.

As shown in FIG. 7, a conductive material layer 114 is deposited within the opening 102 (see FIGS. 1-3). The conductive material layer 114 may be deposited by any technique known in the art, including but not limited to, physical vapor deposition, chemical vapor deposition, electroless, and electroplating. The conductive material layer 114 may include copper, palladium, silver, gold, platinum, and their selective alloys, but is not so limited. It is well known to those skilled in the art that the seed material 112 may be subsumed during the deposition of the conductive material layer 114, such that the seed material 112 may become continuous with the conductive material layer 114, as depicted in FIG. 7.

Figure 8:
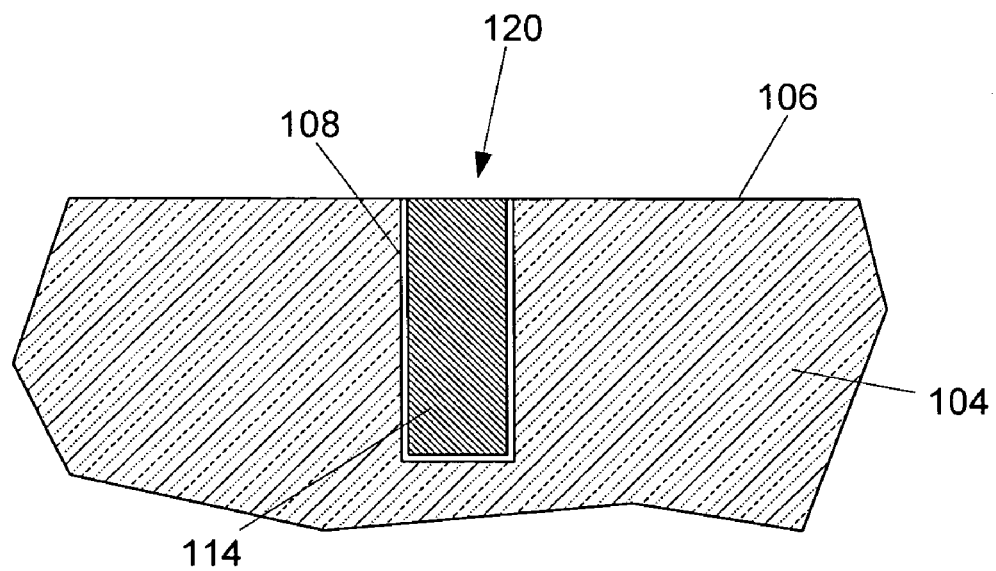
FIG. 8 illustrates a side cross-sectional view of an interconnect formed after removing excess conductive material of FIG. 7 which does not reside within the filled opening, according to the present invention.
Figure 9:
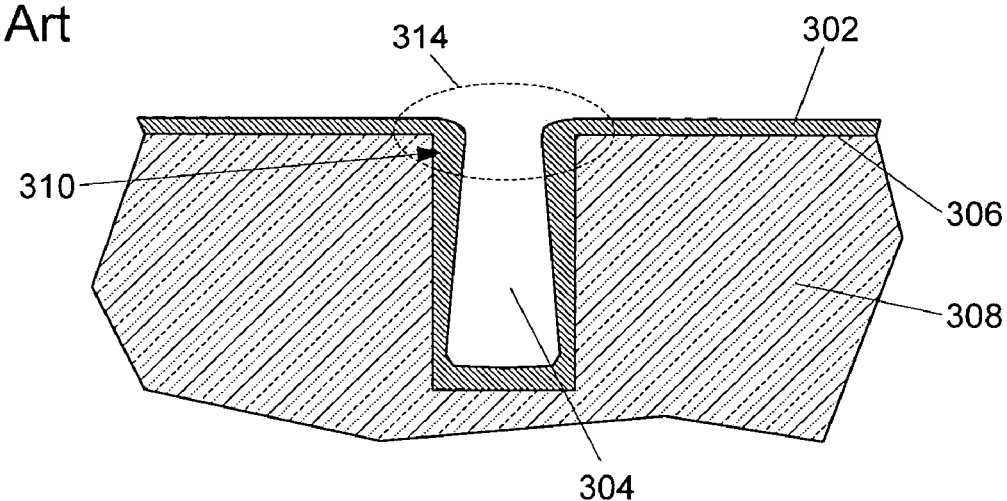
FIG. 9 illustrates a side cross-sectional view of a high aspect ratio opening having a build-up of barrier layer material at the mouth of an opening in a dielectric material during deposition of the barrier material layer, as known in the art
Figure 10:
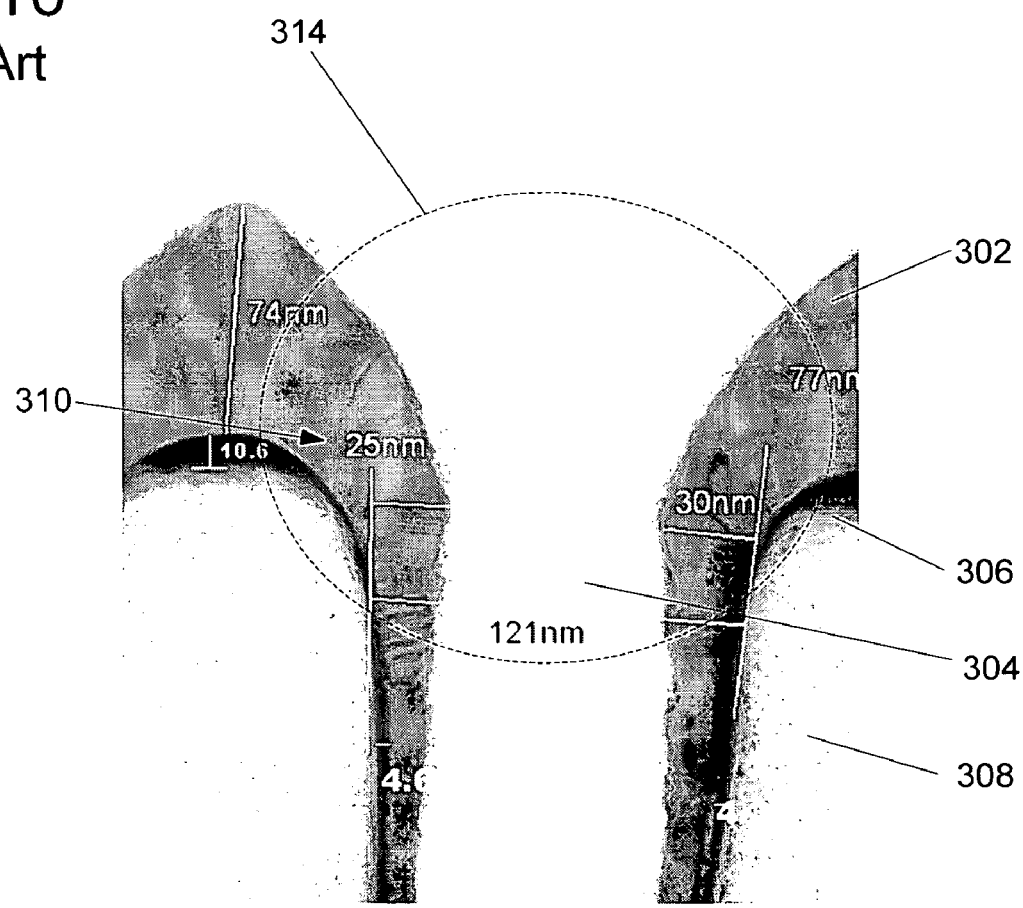
FIG. 10 is a micrograph showing the build-up of barrier material as illustrated in FIG. 9, as known in the art.
Figure 11:
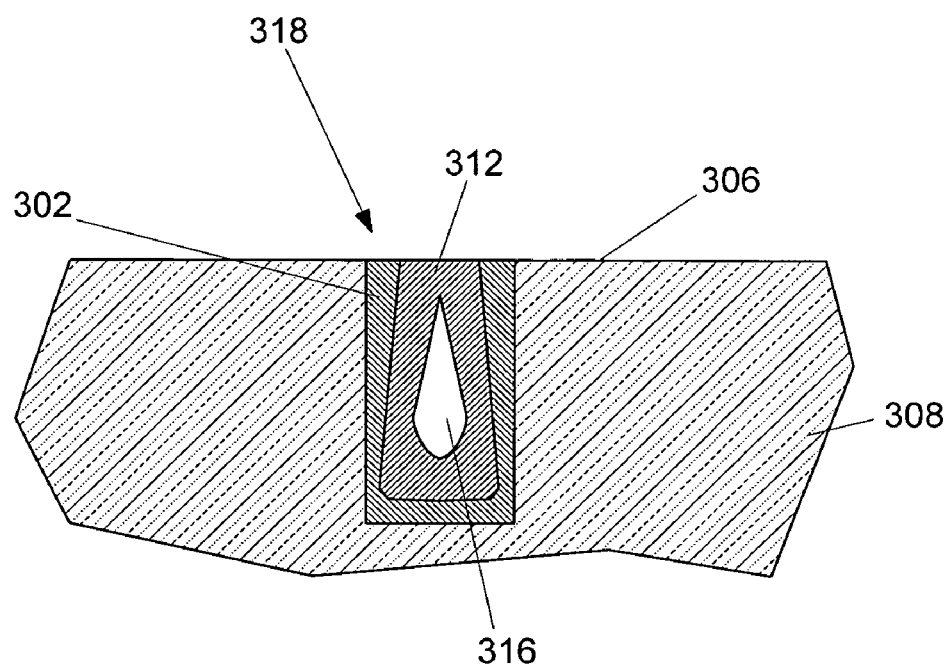
FIG. 11 illustrates a side cross-sectional view of a void within an interconnect, as known in the art.

As shown in FIG. 8, the resulting structure 116 of FIG. 7 is planarized, usually by a technique called chemical mechanical polish (CMP) or by an etching process, which removes the conductive material layer 114 and the barrier material layer 108, which is not within the opening 102 (see FIGS. 1-3), from the dielectric material first surface 106 to form an interconnect 120.

The present invention has been found to have distinct advantages, including, but not limited to, the integration of an ultra-thin (i.e., less than about 5 nm) copper liner and conformal adhesion layers with the use of a coupling agent between the dielectric material 104 and the barrier material layer 108.

Although the description of the present invention is primarily focused on forming an interconnect with metals and their alloys, the teachings and principles of the present invention are not so limited and can be applied to any material (including plastics), any metal compounds or alloys, to any barrier materials, to nanotech devices, and may be used to form electrical isolation structures, such as shallow trench isolation structures, from dielectric materials, as will be understood to those skilled in the art. It is also understood that the present invention may be used at any layer in the fabrication of a microelectronic device from the transistor level through the packaging process.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for fabricating an interconnect structure, comprising:
    providing a dielectric material layer having an opening extending into said dielectric material from a first surface thereof;
    bonding a coupling agent complexed with a catalytic metal to said dielectric material layer within said opening wherein said coupling agent includes a hydroxyl group for intermolecular hydrogen bonding with hydroxyl groups of other coupling agents;
    activating said catalytic metal by reducing said catalytic metal; and
    electrolessly depositing a barrier material layer within said opening.

2. The method of claim 1, wherein bonding said coupling agent complexed with a catalytic metal comprises bonding a coupling agent complexed with palladium to said dielectric material layer within said opening.

3. The method of claim 1, wherein bonding said coupling agent complexed with a catalytic metal comprises bonding a coupling agent complexed with ruthenium to said dielectric material layer within said opening.

4. The method of claim 1, wherein bonding said coupling agent complexed with a catalytic metal comprises bonding a self-assembling monolayer coupling agent complexed with a catalytic metal to said dielectric material layer within said opening.

5. The method of claim 1, wherein bonding said coupling agent complexed with a catalytic metal comprises bonding a coupling agent, selected from the group comprising a phosphine, pyridine, alkl amine, or azo-silane group, complexed with a catalytic metal to said dielectric material layer within said opening.

6. The method of claim 1, wherein bonding said coupling agent complexed with a catalytic metal comprises bonding an azo-silane coupling agent complexed with a catalytic metal to said dielectric material layer within said opening, wherein said azo-silane coupling agent has a general formal of:

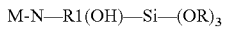
M-N—R1(OH)—Si—(OR)$_3$ wherein: M is said catalytic metal, R1 is C1-C4, and OR are alkyl groups, to said dielectric material layer within said opening.

7. The method of claim 1, wherein providing said nucleation site by bonding said coupling agent complexed with said catalytic metal to said substrate comprises providing said nucleation site by bonding an azo-silane coupling agent having a general formal of:

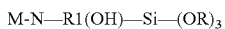
M-N—R1(OH)—Si—(OR)$_3$ wherein: M is said catalytic metal, R1 is C1-C4, and OR are alkyl groups, to said substrate.

8. A method, comprising:
providing a substrate;
providing a nucleation site by bonding a coupling agent complexed with a catalytic metal to said substrate wherein said coupling agent includes a hydroxyl group for intermolecular hydrogen bonding with hydroxyl groups of other coupling agents;
activating said catalytic metal by reducing said catalytic metal; and
electrolessly depositing a barrier material layer abutting said catalytic metal.

9. The method of claim 8, wherein said substrate comprises a dielectric metal.

10. The method of claim 8, wherein providing said nucleation site by bonding said coupling agent complexed with a catalytic metal to said substrate comprises providing a nucleation site by bonding a coupling agent complexed with palladium to said substrate.

11. The method of claim 8, wherein providing said nucleation site by bonding said coupling agent complexed with a catalytic metal to said substrate comprises providing a nucleation site by bonding a coupling agent complexed with ruthenium to said substrate.

12. The method of claim 8, wherein providing said nucleation site by bonding said coupling agent complexed with a catalytic metal to said substrate comprises providing a nucleation site by bonding a self-assembling monolayer coupling agent complexed with said catalytic metal to said substrate.

13. The method of claim 8, wherein providing said nucleation site by bonding said coupling agent complexed with a catalytic metal to said substrate comprises providing a nucleation site by bonding a coupling agent, selected from the group comprising a phosphine, pyridine, alkl amine, or azo-silane group, complexed with a catalytic metal to said dielectric material layer.

* * * * *

UNITED STATES PATENT AND TRADEMARK OFFICE
CERTIFICATE OF CORRECTION

PATENT NO. : 7,629,252 B2  Page 1 of 1
APPLICATION NO. : 11/318137
DATED : December 8, 2009
INVENTOR(S) : O'Brien et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 763 days.

Signed and Sealed this

Twenty-first Day of December, 2010

David J. Kappos
*Director of the United States Patent and Trademark Office*